(12) United States Patent  (10) Patent No.: US 12,082,401 B2
Cao  (45) Date of Patent: Sep. 3, 2024

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Xinman Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 392 days.

(21) Appl. No.: 17/500,524

(22) Filed: Oct. 13, 2021

(65) Prior Publication Data

US 2022/0157829 A1 May 19, 2022

Related U.S. Application Data

(63) Continuation of application No. PCT/CN2021/106757, filed on Jul. 16, 2021.

(30) Foreign Application Priority Data

Nov. 13, 2020 (CN) .......................... 202011265548.0

(51) Int. Cl.
  *H01L 21/308* (2006.01)
  *G11C 5/02* (2006.01)
  *H10B 12/00* (2023.01)

(52) U.S. Cl.
  CPC ........... *H10B 12/488* (2023.02); *G11C 5/025* (2013.01); *H01L 21/308* (2013.01); *H10B 12/30* (2023.02)

(58) Field of Classification Search
  CPC ........... H01L 21/32139; H01L 21/3086; H01L 21/31144; H01L 21/0332; H01L 21/308;
  (Continued)

(56) References Cited

U.S. PATENT DOCUMENTS

2013/0140265 A1   6/2013  Kim et al.
2013/0337652 A1*  12/2013 Sun ................... H01L 21/0337
                                                                257/E21.257
(Continued)

FOREIGN PATENT DOCUMENTS

CN       108400085 A     8/2018
CN       208738230 U     4/2019
(Continued)

OTHER PUBLICATIONS

ISR for International Application PCT/CN2021/106757 mailed Oct. 20, 2021.
(Continued)

*Primary Examiner* — Moazzam Hossain
(74) *Attorney, Agent, or Firm* — Kilpatrick Townsend & Stockton LLP (57) ABSTRACT

Embodiments of the present application relate to a semiconductor structure and a formation method thereof. The semiconductor structure formation method includes the following steps: providing a base, the base including a memory region, the memory region including a substrate, a conductive layer, and a first mask layer located on the conductive layer; patterning the first mask layer to form a plurality of first dot patterns arranged in a first array; backfilling the first mask layer to form a second mask layer covering the first mask layer; patterning the second mask layer to form a plurality of second dot patterns arranged in a second array; and etching the conductive layer by using the first dot pattern and the second dot pattern together as a mask pattern to form a plurality of independent conductive dot patterns.

12 Claims, 9 Drawing Sheets

(58) Field of Classification Search
CPC .............. H01L 21/3081; H01L 21/3088; H01L 21/027–0338; H01L 21/02642; H01L 21/02678; H01L 21/0268; H01L 21/0465; H01L 21/266; H01L 21/28135; H01L 21/426; H01L 21/475; H01L 21/768; H01L 21/1288; H01L 21/66583; H01L 21/67359; H10B 12/01–09
See application file for complete search history.

(56) References Cited

U.S. PATENT DOCUMENTS

2015/0243525 A1    8/2015   Park et al.
2019/0295840 A1*   9/2019   Chang ................. H01L 21/0271

FOREIGN PATENT DOCUMENTS

| CN | 210272255 U | 4/2020 |
|---|---|---|
| CN | 111564364 A | 8/2020 |

OTHER PUBLICATIONS

Written Opinion for International Application PCT/CN2021/106757 mailed Oct. 20, 2021.

* cited by examiner

SEMICONDUCTOR STRUCTURE AND FORMATION METHOD THEREOF

CROSS-REFERENCE TO RELATED APPLICATIONS

This application is a continuation of International Patent Application No. PCT/CN2021/106757 filed on Jul. 16, 2021, which claims priority to Chinese Patent Application No. 202011265548.0 filed on Nov. 13, 2020. The aforementioned patent applications are incorporated by reference in their entireties.

TECHNICAL FIELD

The present application relates to the field of semiconductor manufacturing technologies, and in particular, to a semiconductor structure and a formation method thereof.

BACKGROUND

A Dynamic Random Access Memory (DRAM) is a semiconductor structure member commonly used in computers, and consists of a plurality of memory cells. Each memory cell generally includes a transistor and a capacitor. The transistor has a gate electrically connected to a wordline, a source electrically connected to a bitline and a drain electrically connected to the capacitor. A wordline voltage on the wordline can control ON and OFF of the transistor, so that through the bitline, data information stored in the capacitor can be read or data information is written to the capacitor.

The DRAM generally includes an active region and a peripheral region located outside the active region. The peripheral region is configured to arrange a peripheral circuit structure. The peripheral circuit structure is configured to provide a control signal for the active region. The peripheral region may be divided into a plurality of subregions, for example, a subwordline drive (SWD) region and a sense amplifier (S/A) region. In a semiconductor structure such as an existing DRAM, patterns in the active region and patterns in the plurality of the subregions in the peripheral region are continuous line patterns, and the patterns in the active region, the patterns in the subwordline drive (SWD) region and the patterns in the sense amplifier (S/A) region extend along different directions. During simultaneous photolithography of the active region and the peripheral region, due to structural limitations of a photolithography machine, resolution and roughness of lines in only one or two directions can be ensured to meet requirements by optimizing a light condition, but roughness of lines in other directions (such as a third direction) may increase, which may affect the photolithography quality of patterns in the other directions and ultimately affect the performance of the semiconductor structure.

Therefore, how to ensure the morphology of patterns in different directions of the semiconductor structure, improve the photolithography quality, and improve the performance of the semiconductor structure is an urgent technical problem to be solved currently.

SUMMARY

Embodiments of the present application provide a semiconductor structure and a formation method thereof, which helps to improve the problem that an existing semiconductor structure is prone to large-roughness patterns, so as to improve a manufacturing yield of the semiconductor structure and improve the performance of the semiconductor structure.

The embodiments of the present application provide a semiconductor structure formation method, including the following steps:

providing a base, the base including a memory region, the memory region including a substrate, a conductive layer located on the substrate, and a first mask layer located on the conductive layer;

patterning the first mask layer to form a plurality of first dot patterns arranged in a first array;

backfilling the first mask layer to form a second mask layer covering the first mask layer;

patterning the second mask layer to form a plurality of second dot patterns arranged in a second array, along a direction perpendicular to the substrate, a projection of one of the second dot patterns being located between two adjacent ones of the first dot patterns; and etching the conductive layer by using the first dot pattern and the second dot pattern together as a mask pattern to form a plurality of independent conductive dot patterns.

The embodiments of the present application further provide a semiconductor structure, including:

a base, the base including a memory region, the memory region including a substrate and a plurality of independent conductive dot patterns located on the substrate;

the plurality of independent conductive dot patterns being formed by etching a conducive layer on the substrate by using first dot patterns and second dot patterns together as a mask pattern;

wherein the first dot patterns are formed on a first mask layer on the conductive layer, and the first dot patterns are arranged in a first array; and the second dot patterns are formed on a second mask layer covering the first mask layer, the second dot patterns are arranged in a second array, and along a direction perpendicular to the substrate, a projection of one of the second dot patterns is located between two adjacent ones of the first dot patterns.

In the semiconductor structure and the formation method thereof according to the embodiments of the present application, patterns of the memory region are set to the plurality of independent conductive dot patterns, and patterns of a first peripheral region and a second peripheral region are kept as line patterns, so that the light condition is easily optimized in a photolithography exposure process, so as to simultaneously ensure that the roughness of the patterns of the memory region, the patterns of the first peripheral region and the patterns of the second peripheral region meets process requirements, thereby achieving an increase in a manufacturing yield of the semiconductor structure and helping improve the performance of the semiconductor structure.

BRIEF DESCRIPTION OF DRAWINGS

The above and other objectives, features and advantages of the present application will become more apparent from following descriptions of the embodiments of the present application with reference to accompanying drawings, in which.

DESCRIPTION OF EMBODIMENTS

In order to make the objectives, technical solutions and advantages of the present application clearer, the present application is described in further detail below through embodiments in conjunction with the accompanying drawings. However, it is to be understood that these descriptions are illustrative only and not intended to limit the scope of the present application. Further, in the following, descriptions of known structures and technologies are omitted to avoid unnecessary confusion between concepts of the present application.

Specific implementations of a semiconductor structure and a formation method thereof according to the present application are described in detail below with reference to the accompanying drawings.

Figure 1:
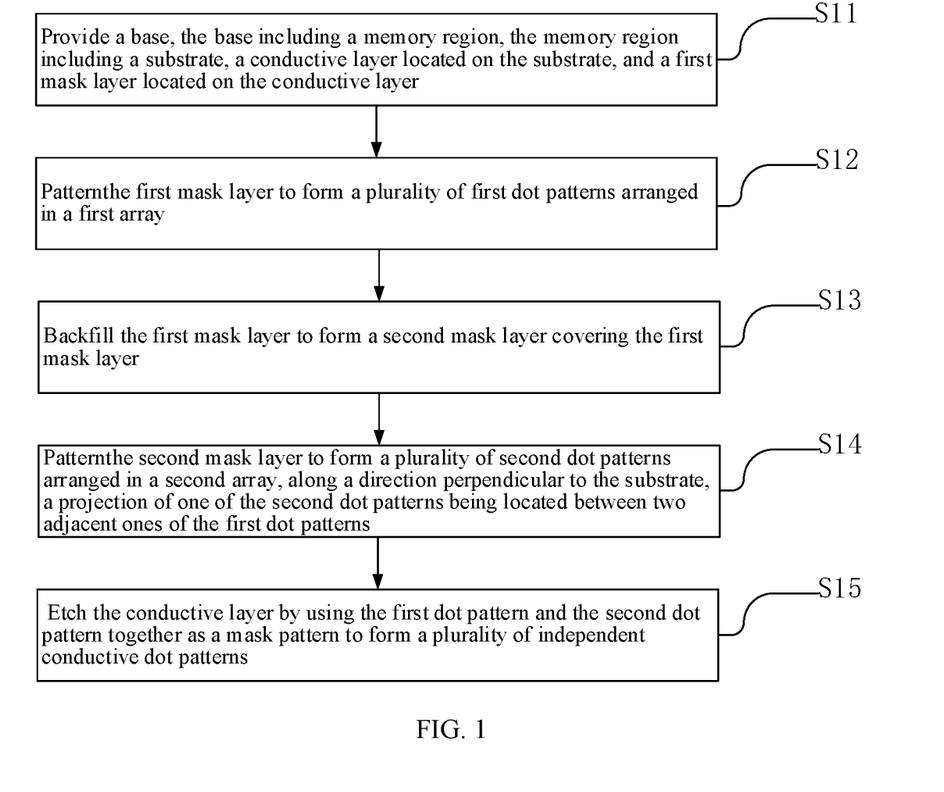
FIG. 1 is a flowchart of a semiconductor structure formation method according to a specific implementation of the present application.

The specific implementations provide a semiconductor structure. FIG. 1 is a flowchart of a semiconductor structure formation method according to a specific implementation of the present application, FIG. 2A to FIG. 2I are schematic cross-sectional views of main processes during the formation of the semiconductor structure according to a specific implementation of the present application, and FIG. 3A to FIG. 3H are schematic top views of the main processes during the formation of the semiconductor structure according to a specific implementation of the present application. As shown in FIG. 1, FIG. 2A to FIG. 2I and FIG. 3A to FIG. 3H, the semiconductor structure formation method according to the specific implementation of the present application includes the following steps.

Figure 2A:
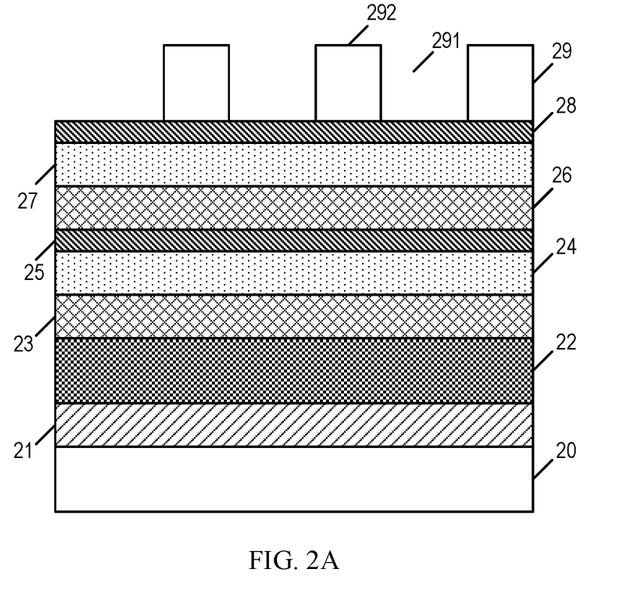
FIG. 2A to FIG. 2I are schematic cross-sectional views of main processes during the formation of a semiconductor structure according to a specific implementation of the present application.
Figure 3A:
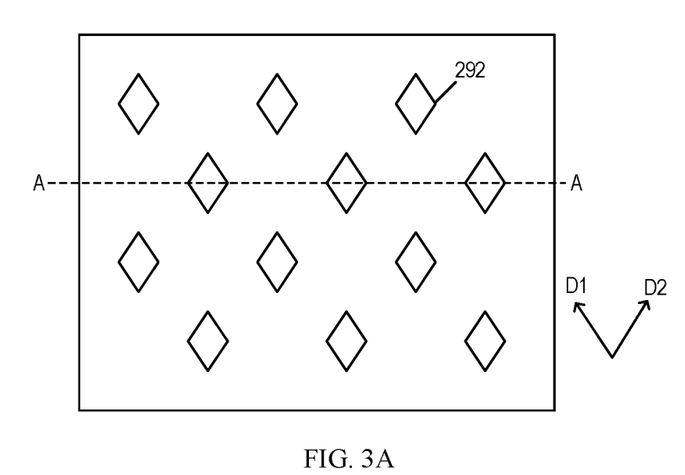
FIG. 3A to FIG. 3H are schematic top views of the main processes during the formation of the semiconductor structure according to a specific implementation of the present application.

In step S11, a base is provided, the base including a memory region AA, the memory region AA including a substrate 20, a conductive layer 21 located on the substrate 20, and a first mask layer 26 located on the conductive layer 21, as shown in FIG. 2A and FIG. 3A.

In an optional implementation, the base further includes a first peripheral region P1 and a second peripheral region P2 located outside the memory region AA;
  the first peripheral region P1 is configured to form a first line pattern 41; and
  the second peripheral region P2 is configured to form a second line pattern 42, and an extension direction of the first line pattern 41 intersects with an extension direction of the second line pattern 42, as shown in FIG. 2A. A relative position relationship among the memory region AA, the first peripheral region P1 and the second peripheral region P2 may be obtained with reference to FIG. 3H.

The memory region AA is configured to store information. The first peripheral region P1 and the second peripheral region P2 are arranged outside the memory region AA. For example, the first peripheral region P1 is a wordline driver region, and the second peripheral region P2 is a sense amplifier region. The first line pattern 41 is configured to form a first welding pad to transmit a first control signal (for example, a wordline drive signal) to the memory region AA. The second line pattern 42 is configured to form a second welding pad to transmit a second control signal (for example, a sense amplification signal) to the memory region AA. A description is provided in the specific implementation with an example in which the first peripheral region P1 and the second peripheral region P2 are arranged on two adjacent sides of the memory region AA. Those skilled in the art may also adjust the relative position relationship among the first peripheral region P1, the second peripheral region P2 and the memory region AA according to an actual requirement.

Figure 2B:
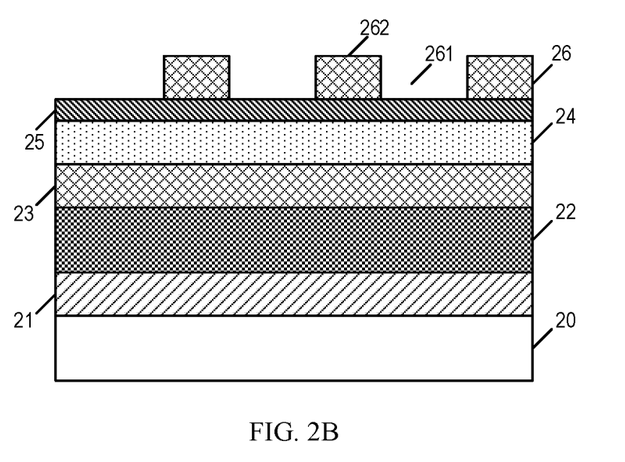
Figure 3B:
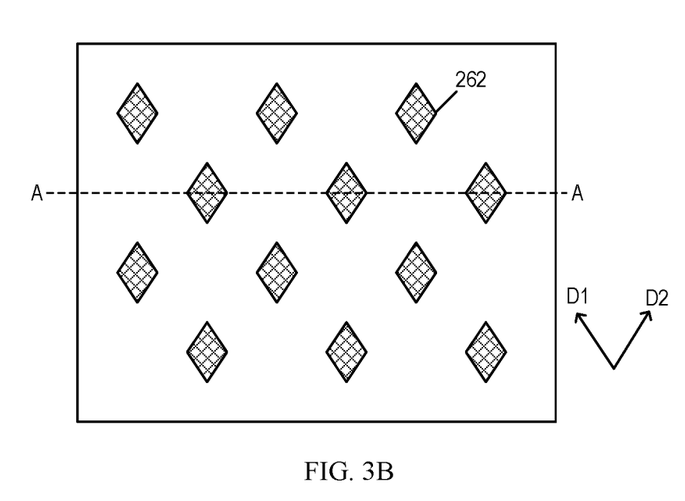

In step S12, the first mask layer 26 is patterned to form a plurality of first dot patterns 262 arranged in a first array, as shown in FIG. 2B and FIG. 3B. FIG. 2B is a cross-sectional view taken along a direction AA in FIG. 3B.

In an optional implementation, the step of patterning the first mask layer 26 specifically includes:
  forming a first cover layer on a surface of the first mask layer 26;
  forming a first photoresist layer 29 on a surface of the first cover layer, the first photoresist layer 29 having a plurality of first etch patterns 292 arranged in the first array;
  etching the first cover layer and the first mask layer 26 by using the first etch pattern 292 as a mask pattern to form the plurality of first dot patterns 262 arranged in the first array; and
  removing the first photoresist layer 29 and the first cover layer.

The formation of the first cover layer is intended to ensure the morphology of the first dot pattern 262 formed in the first mask layer 26. The first cover layer may be of a monolayer structure or a multi-layer structure. A description is given below with an example in which the first cover layer includes a first sublayer 27 and a second sublayer 28 superimposed on each other. Firstly, the first sublayer 27 is formed on the surface of the first mask layer 26. Then, the second sublayer 28 is formed on a surface of the first sublayer 27. Next, the patterned first photoresist layer 29 is formed on a surface of the second sublayer 28; that is, the first photoresist layer 29 is divided into the plurality of first etch patterns 292 arranged in the first array by forming a first opening 291 exposing the second sublayer 28 in the first photoresist layer 29, as shown in FIG. 2A and FIG. 3A. FIG. 2A is a cross-sectional view taken along a direction AA in FIG. 3A. Finally, the second sublayer 28, the first sublayer 27 and the first mask layer 26 are etched by using the first etch pattern 292 as a mask pattern, and the first photoresist layer 29, the second sublayer 28 and the first sublayer 27 are removed to obtain structures as shown in FIG. 2B and FIG. 3B. Through the etch in this step, a first trench 261 (refer to FIG. 2B) passing through the first mask layer 26 and extending along a first direction (for example, a direction D1 in FIG. 3A to FIG. 3H) is formed in the first mask layer 26, so as to divide the first mask layer 26 into the plurality of first dot patterns 262 arranged in the first array. The first mask layer 26 may be made of an oxide material, such as silicon oxide. The first sublayer 27 may be made of a Spin On Hardmask (SOH) material. The second sublayer 28 may be made of a nitrogen oxide material, such as silicon oxynitride. In this specific implementation, the first array may be a square array or a hexagonal array, which may be set by those skilled in the art according to an actual requirement. In this step, during the formation of the plurality of first dot patterns 262 arranged in the first array, the first line pattern 41 is formed in the first peripheral region P1 and the second line pattern 42 is formed in the second peripheral region P2 simultaneously. The plurality of first dot patterns 262 arranged in the first array are formed in the memory region AA; that is, no line patterns are formed in the memory region AA, and only line photomasks in two directions (i.e., the extension direction of the first line pattern 41 and the extension direction of the second line pattern 42) are needed; therefore, the roughness uniformity of the first dot pattern 262, the first line pattern 41 and the second line pattern 42 can be simultaneously ensured by optimizing the light condition.

Figure 2C:
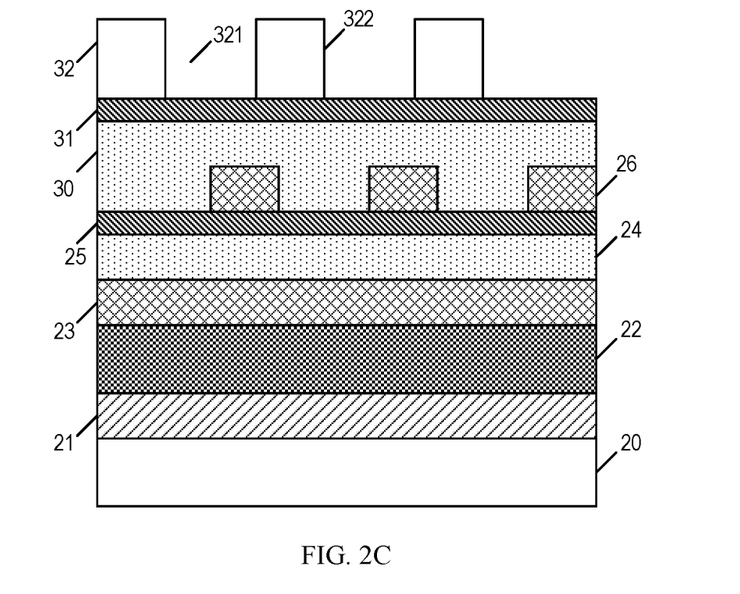

In step S13, the first mask layer 26 is backfilled to form a second mask layer 30 covering the first mask layer 26, as shown in FIG. 2C.

In an optional implementation, the step of forming a second mask layer 30 covering the first mask layer 26 specifically includes: backfilling a first trench 261 located between adjacent ones of the first dot patterns 262 to form the second mask layer 30 filling the first trench 261 and covering a top surface of the first mask layer 26.

Specifically, the first trench 261 may be backfilled by chemical vapor deposition, physical vapor deposition or atomic layer deposition to form the second mask layer 30 filling the first trench 261 and covering the top surface of the first mask layer 26 (i.e., a surface of the first mask layer 26 away from the substrate 20). A higher etch selectivity ratio exists between a material of the second mask layer 30 and the material of the first mask layer 26 (for example, the etch selectivity ratio is greater than 3, such as 4 and 8), so as to facilitate subsequent selective etch. For example, the second mask layer 30 may be made of a spin on hardmask material.

In step S14, the second mask layer 30 is patterned to form a plurality of second dot patterns arranged in a second array, along a direction perpendicular to the substrate 20, a projection of one of the second dot patterns being located between two adjacent ones of the first dot patterns 262.

Figure 3C:
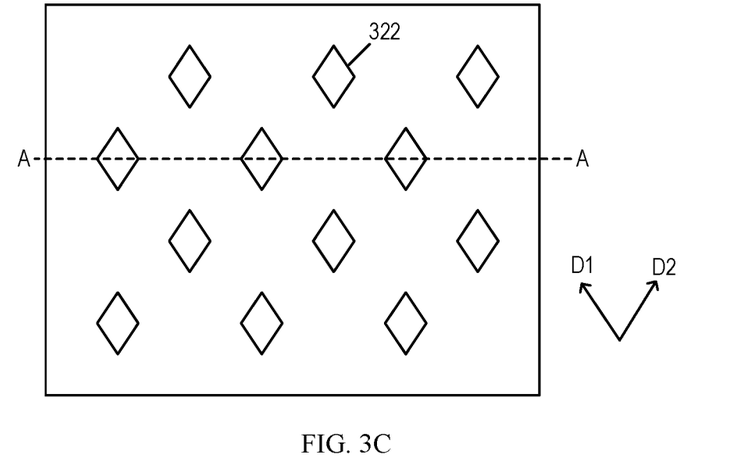

Specifically, the step of patterning the second mask layer 30 is specifically as follows. Firstly, a second cover layer 31 covering a surface of the second mask layer 30 is formed. Then, a patterned second photoresist layer 32 is formed on a surface of the second cover layer 31, a second opening 321 exposing the second cover layer 31 is formed in the second photoresist layer 32, so that the second photoresist layer 32 is divided into a plurality of second etch patterns 322 arranged in the second array, as shown in FIG. 2C and FIG. 3C; FIG. 2C is a cross-sectional view taken along a direction AA in FIG. 3C. Finally, the second cover layer 31 and the second mask layer 30 are etched by using the second etch pattern 322 as a mask pattern to form a second trench (not shown in the figure) passing through the second mask layer 30 and extending along a second direction (for example, a direction D2 in FIG. 3A to FIG. 3H). The first direction intersects with the second direction. A plurality of second trenches divide the second mask layer 30 into a plurality of second dot patterns arranged in the second array. The intersection in this specific implementation may be vertical intersection or oblique intersection. The second cover layer 31 may be made of, but is not limited to, silicon oxynitride. Along a direction perpendicular to the substrate 20, a projection of one second dot pattern is located between two adjacent first dot patterns 262; that is, the second array is misaligned with the first array. The second array may be a square array or a hexagonal array.

Figure 2D:
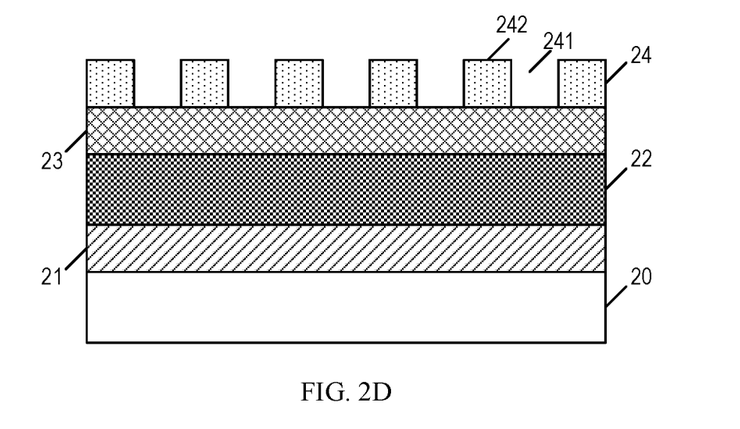
Figure 2E:
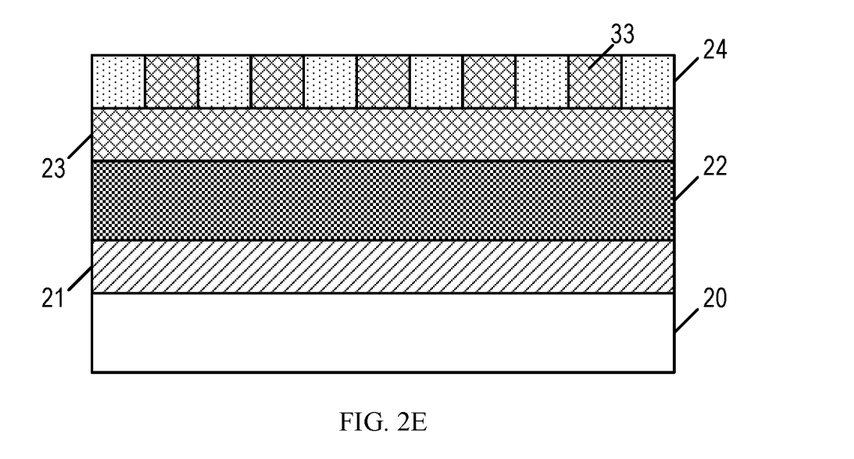
Figure 2F:
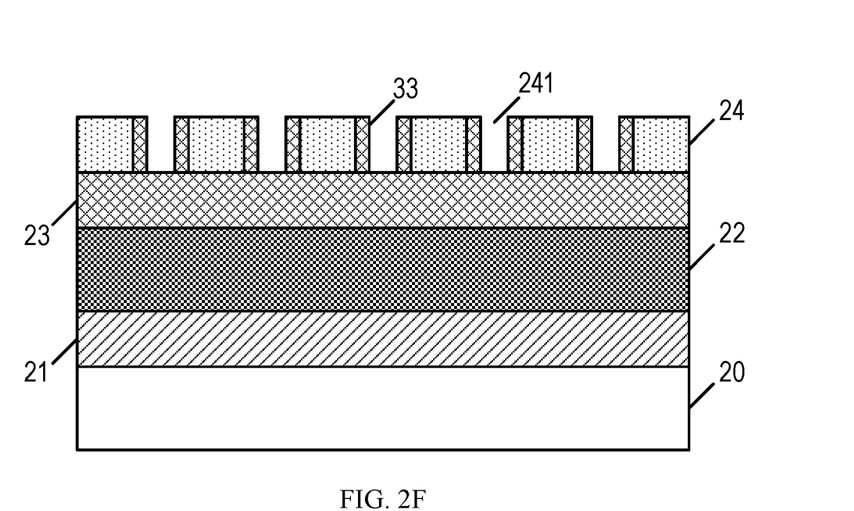
Figure 2G:
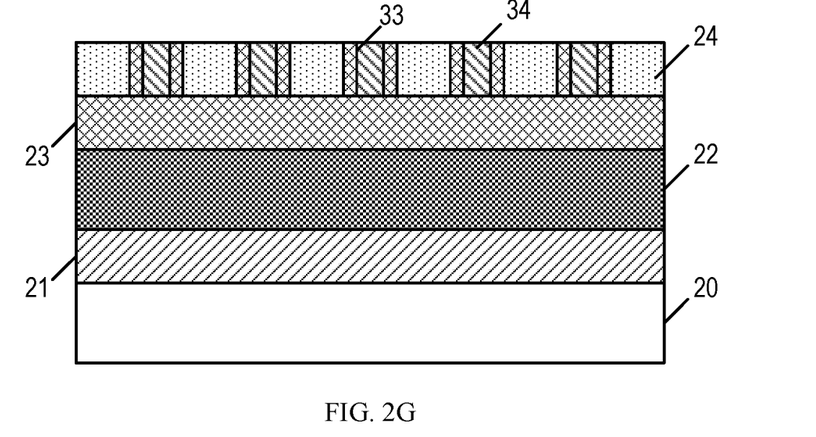
Figure 2H:
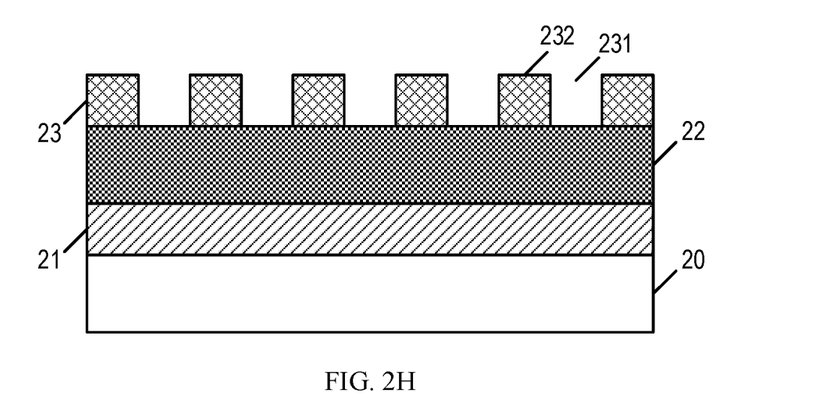
Figure 2I:
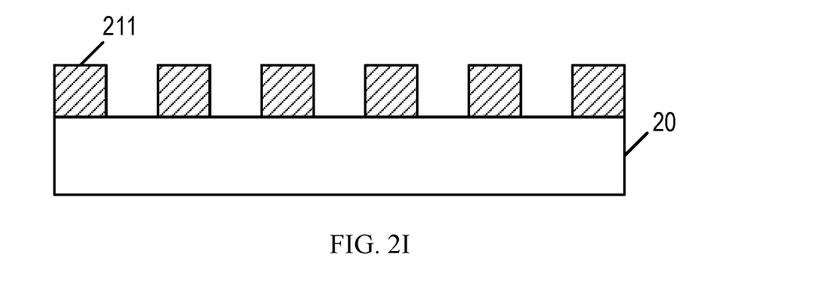
Figure 3D:
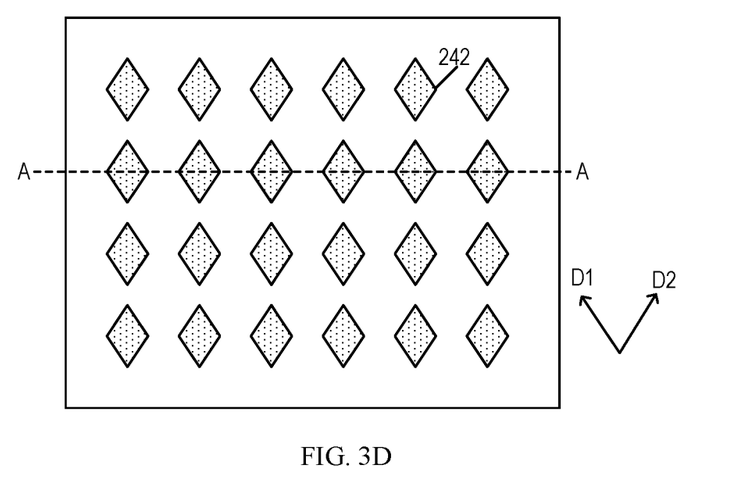
Figure 3E:
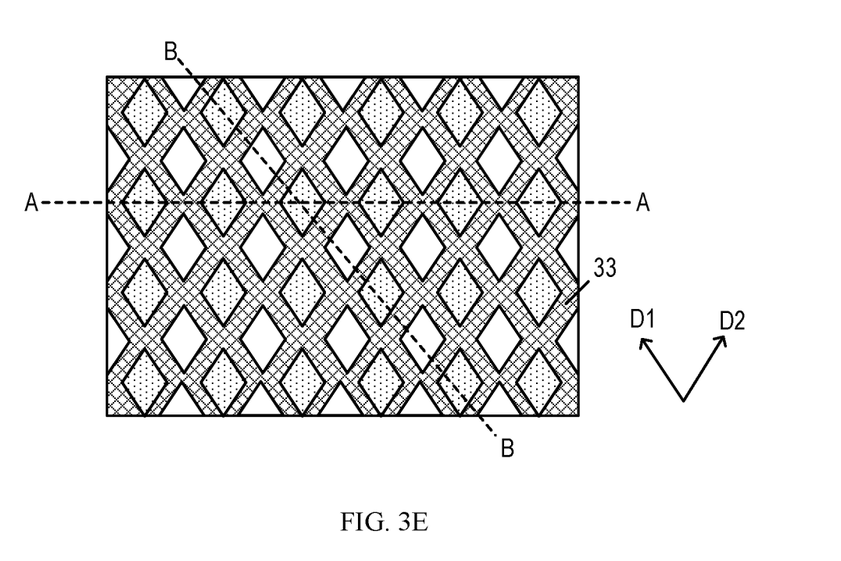
Figure 3F:
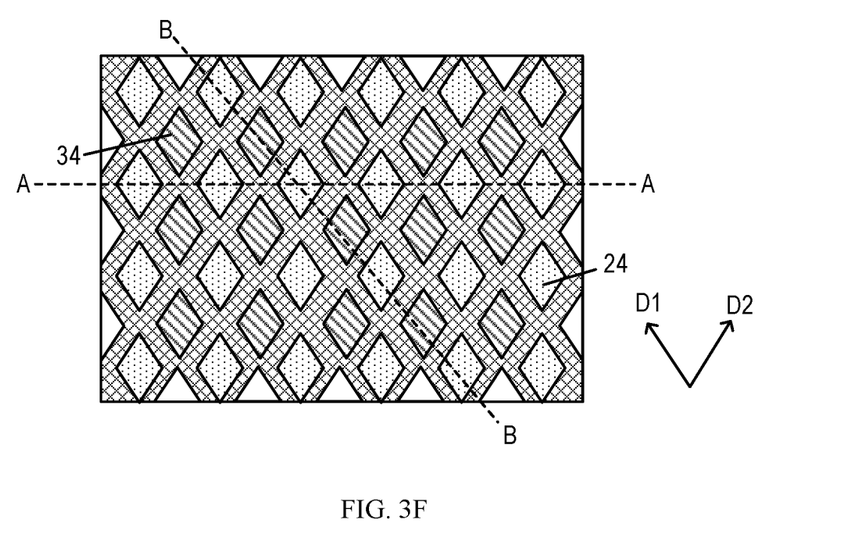
Figure 3G:
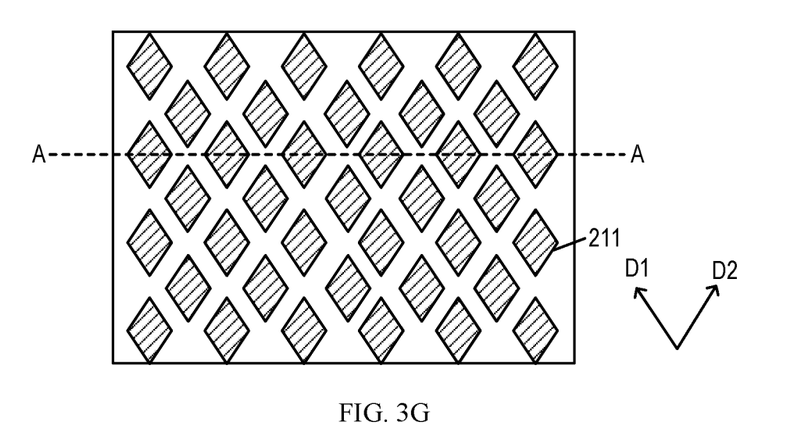
Figure 3H:
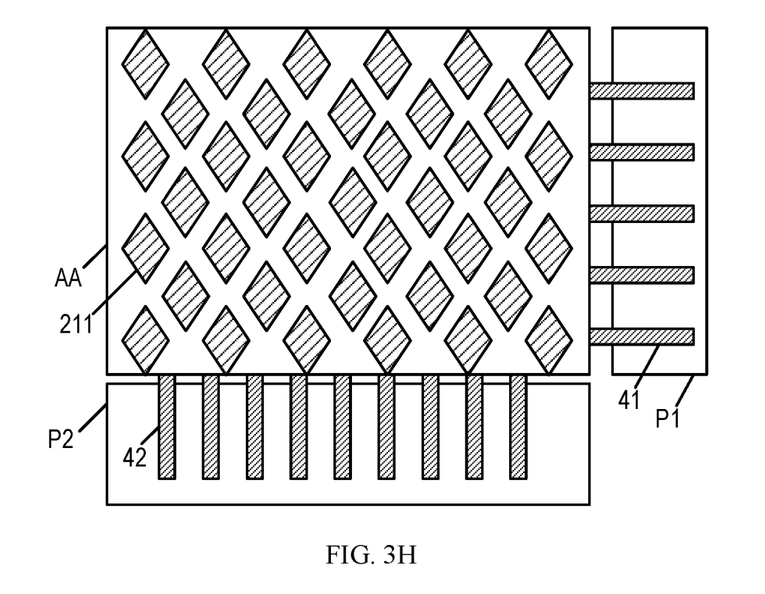

In step S15, the conductive layer 21 is etched by using the first dot pattern 262 and the second dot pattern together as a mask pattern to form a plurality of independent conductive dot patterns 211, as shown in FIG. 2I, FIG. 3G and FIG. 3H. FIG. 2I is a cross-sectional view taken along a direction AA in FIG. 3G.

In an optional implementation, the memory region AA further includes a third mask layer 24 located between the conductive layer 21 and the first mask layer 26. The step of etching the conductive layer 21 by using the first dot pattern 262 and the second dot pattern together as a mask pattern specifically includes:

etching the third mask layer 24 by using the first dot pattern 262 and the second dot pattern together as a mask pattern to form a plurality of third dot patterns 242 arranged in a third array and a third trench 241, as shown in FIG. 2D and FIG. 3D, wherein FIG. 2D is a cross-sectional view taken along a direction AA in FIG. 3D; and etching the conductive layer 21 by using the third dot pattern as a mask pattern 242.

In an optional implementation, the third array is a combination of a projection of the first array along the direction perpendicular to the substrate 20 and a projection of the second array along the direction perpendicular to the substrate 20.

In an optional implementation, the step of etching the conductive layer 21 by using the third dot pattern 242 as a mask pattern specifically includes:

forming a side wall 33 covering a sidewall of the third trench 241, the side walls between adjacent third dot patterns 242 being connected to one another, as shown in FIG. 2E, FIG. 2F and FIG. 3E, wherein FIG. 2E is a cross-sectional view taken along a direction AA in FIG. 3E, and FIG. 2F is a cross-sectional view taken along a direction BB in FIG. 3E;

selectively etching the side walls 33 in the third trench 241, removing the side wall 33 in the middle of the third trench 241, and retaining the side wall 33 in contact with the third mask layer 24, as shown in FIG. 2F;

backfilling the third mask layer 24 in a portion from which the side wall 33 is removed, so as to form a filling layer 34, as shown in FIG. 2G; forming a plurality of fourth dot patterns formed by the filling layer 34 and a residue of the third mask layer 24 jointly and arranged in a fourth array, as shown in FIG. 3F; and etching the conductive layer 21 by using the fourth dot pattern as a mask pattern.

In an optional implementation, the memory region AA further includes a fourth mask layer 23 located between the third mask layer 24 and the conductive layer 21, and the fourth mask layer 23 is made of a material the same as the side wall 33; and the following steps are further included:

removing the side wall 33 and part of the fourth mask layer 23, a residue of the fourth mask layer 23 forming a plurality of fifth dot patterns 232 arranged in the fourth array, as shown in FIG. 2H;

etching the conductive layer 21 by using the fifth dot pattern 232 as a mask pattern, and dividing the conductive layer 21 into a plurality of independent conductive dot patterns 211; and removing the fourth mask layer 23.

Specifically, a third cover layer 25 may be further arranged between the first mask layer 26 and the third mask layer 24, the fourth mask layer 23 is arranged between the third mask layer 24 and the conductive layer 21, and a fifth mask layer 22 is further arranged between the fourth mask layer 23 and the conductive layer 21. Firstly, the third cover layer 25 and the third mask layer 24 are etched by using the first dot pattern 262 and the second dot pattern together as a mask pattern to form a plurality of third trenches 241 passing through the third mask layer 24, and the plurality of third trenches 241 divide the third mask layer 24 into a plurality of third dot patterns 242 arranged in a third array, as shown in FIG. 2D. The third array is a combination of the first array and the second array. That is, along the direction perpendicular to the substrate 20, a projection of the first array and a projection of the second array jointly constitute the third array. Next, the side wall 33 is deposited on a sidewall surface of the third dot pattern 242 by using an atomic layer deposition process, as shown in FIG. 2E, FIG. 2F and FIG. 3E. FIG. 2E is a cross-sectional view taken along a direction AA in FIG. 3E, and FIG. 2F is a cross-sectional view taken along a direction BB in FIG. 3E. The thickness of the side wall 33 can be precisely controlled through the atomic layer deposition process, so as to control a feature size of a subsequently-formed conductive dot pattern 211. The side wall 33 does not completely fill the third trench 241. Specifically, the side wall 33 fills a position in contact with the third mask layer 24, but does not fill the middle of the third trench 241. Afterwards, the third mask layer 24 is backfilled; that is, the remaining space of the third trench 241 is filled with the filling layer 34, as shown in FIG. 2G and FIG. 3F. FIG. 2G is a cross-sectional view taken along a direction BB in FIG. 3F. Next, the side wall 33 is etched back, and after the side wall 33 is removed, the filling layer 34 and a residue of the third mask layer 24 jointly form a plurality of fourth dot patterns arranged in a fourth array. The adding of the filling layer 34 enables arrangement of the fourth array to be denser than arrangement of the third array. At the same time, the side walls 33 between adjacent third dot patterns 242 are controlled to be connected to one another, so as to separate adjacent filling layers 34, thereby ensuring an interval between adjacent fourth dot patterns in the fourth array formed. Since the material of the side wall 33 is set to be the same as the material of the fourth mask layer 23, the fifth mask layer 22 may be used as an etch stop layer, the side wall and the fourth mask layer 23 are etched to form, in the fourth mask layer 23, a plurality of fifth trenches 231 passing through the fourth mask layer 23 and exposing the fifth mask layer 22, and the plurality of fifth trenches 231 divide the fourth mask layer into a plurality of fifth dot patterns 232 arranged in the fourth array, as shown in FIG. 2H. Finally, the fifth mask layer 22 and the conductive layer 21 are etched by using the fifth dot pattern 232 as a mask pattern, and the conductive layer 21 is divided into a plurality of independent conductive dot patterns 211, as shown in FIG. 2I, FIG. 3G and FIG. 3H. The third mask layer 24 may be made of a spin on hardmask material. The third cover layer 25 may be made of, but is not limited to, silicon oxynitride. The fourth mask layer 23 and the side wall 33 may be made of a same oxide material, such as silicon oxide. The fifth mask layer 22 may be made of an organic mask material, such as amorphous carbon (ACL).

In an optional implementation, the conductive dot pattern 211 is in a shape of a circle, an ellipse, or any polygon.

In addition, this specific implementation further provides a semiconductor structure. The semiconductor structure according to this specific implementation may be formed with the method shown in FIG. 1, FIG. 2A to FIG. 2I and FIG. 3A to FIG. 3H. A schematic diagram of the semiconductor structure according to this specific implementation may be obtained with reference to FIG. 2I and FIG. 3H. As shown in FIG. 2I and FIG. 3H, the semiconductor structure according to this specific implementation includes:

a base, the base including a memory region AA and a first peripheral region P1 and a second peripheral region P2 located outside the memory region AA;

the first peripheral region P1 having a first line pattern 41, the second peripheral region P2 having a second line pattern 42, and an extension direction of the first line pattern 41 intersecting with an extension direction of the second line pattern 42; and the memory region AA including a substrate 20 and a plurality of independent conductive dot patterns 211 located on the substrate 20.

In an optional implementation, an arrangement direction of the plurality of conductive dot patterns 211 is different from the extension direction of the first line pattern 41 and the extension direction of the second line pattern 42.

In an optional implementation, the first peripheral region P1 is a wordline driver region, and the second peripheral region P2 is a sense amplifier region.

In an optional implementation, the first line pattern 41, the second line pattern 42 and the conductive dot pattern 211 are arranged on a same layer.

In an optional implementation, the conductive dot pattern 211 is in a shape of a circle, an ellipse, or any polygon.

In the semiconductor structure and the formation method thereof according to the specific implementations, patterns of the memory region are set to a plurality of independent dot patterns, and patterns of the first peripheral region and the second peripheral region are kept as line patterns, so that the light condition is easily optimized in a photolithography exposure process, so as to simultaneously ensure that the roughness of the patterns of the memory region, the patterns of the first peripheral region and the patterns of the second peripheral region meets process requirements, thereby achieving an increase in a manufacturing yield of the semiconductor structure and helping improve the performance of the semiconductor structure.

It should be understood that the above specific implementations of the present application are intended only to illustrate or explain the principles of the present application, and are not intended to limit the present application. Therefore, any modifications, equivalent replacements, improvements and the like made without departing from the spirit and the scope of the present application are intended to be included within the protection scope of the present application. Furthermore, the appended claims of the present application are intended to cover all changes and modified examples that fall within the scope and bounds or equivalents of such scope and bounds of the appended claims.

What is claimed is:

1. A method for forming a semiconductor structure formation, comprising the following steps:

providing a base, the base comprising a memory region, the memory region comprising a substrate, a conductive layer located on the substrate, a fourth mask layer located on the conductive layer, a third mask layer located on the fourth mask layer, and a first mask layer located on the third mask layer;

patterning the first mask layer to form a plurality of first dot patterns arranged in a first array;

backfilling the first mask layer to form a second mask layer covering the first mask layer;

patterning the second mask layer to form a plurality of second dot patterns arranged in a second array, along a direction perpendicular to the substrate, a projection of one of the second dot patterns being located between two adjacent ones of the first dot patterns; and etching the third mask layer by using the first dot pattern and the second dot pattern together as a mask pattern to form a plurality of third dot patterns arranged in a third array;

forming a side wall covering a sidewall of the third dot pattern, the side walls between adjacent ones of the third dot patterns being connected to one another, wherein the fourth mask layer is made of a material the same as the side wall;

backfilling the third mask layer to form a filling layer;

removing the side wall to form a plurality of fourth dot patterns formed by the filling layer and a residue of the third mask layer jointly and arranged in a fourth array;

etching the fourth mask layer by using the fourth dot pattern as a mask pattern to removing part of the fourth mask layer, a residue of the fourth mask layer forming a plurality of fifth dot patterns arranged in the fourth array;

etching the conductive layer by using the fifth dot pattern as a mask pattern, and dividing the conductive layer into a plurality of independent conductive dot patterns; and removing the fourth mask layer.

2. The method for forming a semiconductor structure according to claim 1, wherein the step of patterning the first mask layer comprises:

forming a first cover layer on a surface of the first mask layer;

forming a first photoresist layer on a surface of the first cover layer, the first photoresist layer having a plurality of first etch patterns arranged in the first array;

etching the first cover layer and the first mask layer by using the first etch pattern as a mask pattern to form the plurality of first dot patterns arranged in the first array; and removing the first photoresist layer and the first cover layer.

3. The method for forming a semiconductor structure according to claim 1, wherein the step of forming the second mask layer covering the first mask layer comprises:

backfilling a first trench located between adjacent ones of the first dot patterns to form the second mask layer filling the first trench and covering a top surface of the first mask layer.

4. The method for forming a semiconductor structure according to claim 1, wherein the third array is a combination of a projection of the first array along the direction perpendicular to the substrate and a projection of the second array along the direction perpendicular to the substrate.

5. The method for forming a semiconductor structure according to claim 1, wherein the conductive dot pattern is in a shape of a circle, an ellipse, or any polygon.

6. The method for forming a semiconductor structure according to claim 1, wherein the base further comprises a first peripheral region and a second peripheral region both located at the periphery of the memory region;

the first peripheral region is configured to form a plurality of first line patterns; and the second peripheral region is configured to form a plurality of second line patterns, and an extension direction of the first line pattern intersects with an extension direction of the second line pattern.

7. A semiconductor structure formed by the method for forming the semiconductor structure of claim 1, wherein the semiconductor structure comprises a base, the base comprising a memory region, the memory region comprising a substrate and a plurality of independent conductive dot patterns located on the substrate.

8. The semiconductor structure according to claim 7, wherein the base further comprises a first peripheral region and a second peripheral region both located at the periphery of the memory region;

the first peripheral region is configured to form a plurality of first line patterns; and the second peripheral region is configured to form a plurality of second line patterns, and an extension direction of the first line pattern intersects with an extension direction of the second line pattern.

9. The semiconductor structure according to claim 8, wherein an arrangement direction of the plurality of conductive dot patterns is different from the extension direction of the first line pattern and the extension direction of the second line pattern.

10. The semiconductor structure according to claim 8, wherein the first peripheral region is a wordline driver region, and the second peripheral region is a sense amplifier region.

11. The semiconductor structure according to claim 8, wherein the first line pattern, the second line pattern and the conductive dot pattern are arranged on a same layer.

12. The semiconductor structure according to claim 7, wherein the conductive dot pattern is in a shape of a circle, an ellipse, or any polygon.

* * * * *